(12) United States Patent
Tae

(10) Patent No.: US 8,315,828 B2
(45) Date of Patent: Nov. 20, 2012

(54) BATTERY MANAGEMENT SYSTEM AND DRIVING METHOD FOR THE SAME

(75) Inventor: Yongjun Tae, Suwon-si (KR)

(73) Assignee: SB LiMotive Co., Ltd., Suwon-si, Gyeonggi-do (KR)

( * ) Notice: Subject to any disclaimer, the term of this patent is extended or adjusted under 35 U.S.C. 154(b) by 268 days.

(21) Appl. No.: 12/662,482

(22) Filed: Apr. 20, 2010

(65) Prior Publication Data
US 2010/0268493 A1 Oct. 21, 2010

(30) Foreign Application Priority Data

Apr. 21, 2009 (KR) .................. 10-2009-0034740

(51) Int. Cl.
*G01R 31/36* (2006.01)
*G01F 19/00* (2006.01)

(52) U.S. Cl. ........................... 702/63; 320/134
(58) Field of Classification Search .................. 702/63; 320/134
See application file for complete search history.

(56) References Cited

U.S. PATENT DOCUMENTS

| 5,563,496 | A | 10/1996 | McLure |
| 5,841,996 | A | 11/1998 | Nolan et al. |
| 7,152,027 | B2 * | 12/2006 | Andrade et al. ........... 703/21 |
| 2007/0076593 | A1 * | 4/2007 | Sakurai et al. ........... 370/219 |
| 2007/0090798 | A1 * | 4/2007 | Yun et al. ................. 320/116 |
| 2008/0191664 | A1 | 8/2008 | Abe |
| 2008/0224907 | A1 * | 9/2008 | Adamo et al. ............ 341/141 |

FOREIGN PATENT DOCUMENTS

| JP | 2000-241520 A | 9/2000 |
| JP | 2008-199822 A | 8/2008 |
| KR | 10 2001-0084385 A | 9/2001 |
| KR | 10 2004-0104574 A | 12/2004 |
| KR | 10 2007-0109084 A | 11/2007 |
| KR | 10 2008-0013136 A | 2/2008 |
| KR | 10-0814883 B1 | 3/2008 |

OTHER PUBLICATIONS

Korean Office Action in KR 10-2009-0034740, dated Oct. 27, 2010 (TAE).

* cited by examiner

*Primary Examiner* — Sujoy Kundu
*Assistant Examiner* — Haidong Zhang
(74) *Attorney, Agent, or Firm* — Lee & Morse, P.C.

(57) ABSTRACT

Disclosed are a battery management system that uses a source file for sensing of the cell voltages of battery cells by changing only declaration information of a header file using an MCU even when the number of battery cells is changed, and a driving method for the same. The battery management system is connected to a battery including at least one battery pack in which a plurality of battery cells are contained. includes a sensor including an AD converter connected to the battery cells, the sensor configured to sense cell voltages of the battery cells, a storage configured to store source data generated using an input external signal, and a controller configured to generate a source signal corresponding to the source data and forward the source signal to the sensor, the sensor being configured to sense the cell voltages of the battery cells according to the source signal.

14 Claims, 5 Drawing Sheets

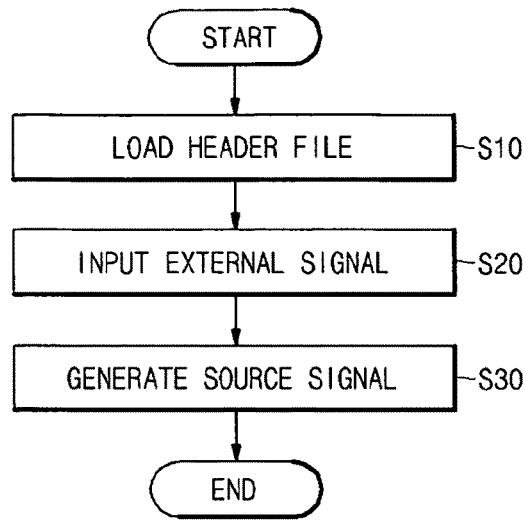
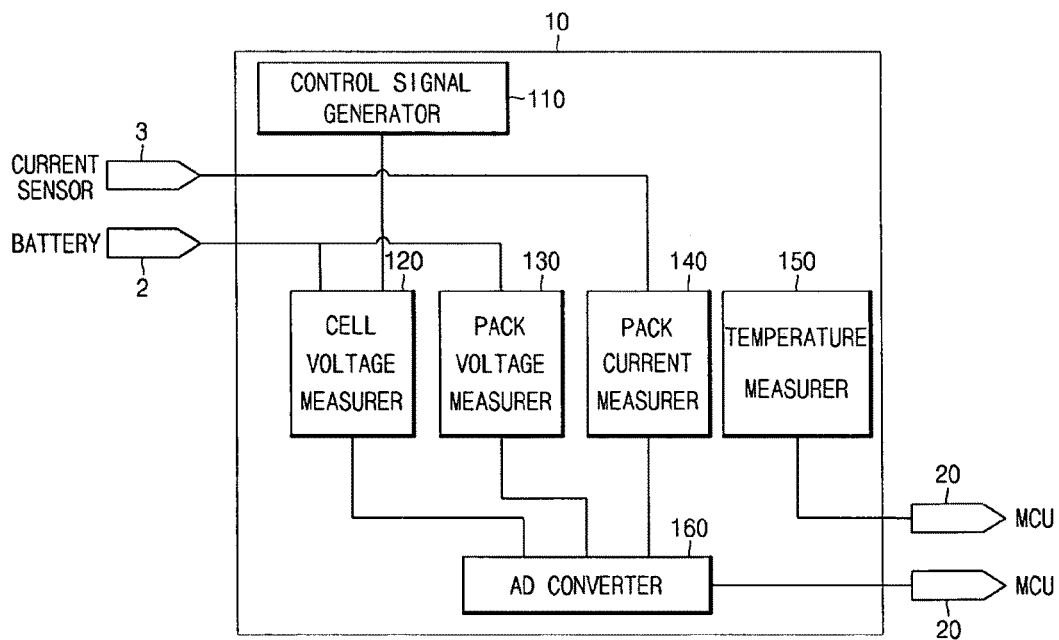

BATTERY MANAGEMENT SYSTEM AND DRIVING METHOD FOR THE SAME

BACKGROUND

1. Field

Embodiments relate to a battery management system and a driving method for the same.

2. Description of the Related Art

Vehicles that use internal combustion engines whose main fuels are gasoline or heavy oil have serious influence on pollution such as air contamination. Therefore, in recent years, electric vehicles or hybrid vehicles are being developed to reduce pollution.

An electric vehicle uses an electric motor operated by electrical energy output from a battery. Such an electrical vehicle may use a battery having a battery pack in which a plurality of rechargeable battery cells are contained as a main power source. Accordingly, an electric vehicle does not generate exhaust gas and reduces noise.

A hybrid vehicle is a vehicle that uses two or more types of power sources, e.g., an internal combustion engine and an electric motor (or battery-motor). Currently, combined hybrid vehicles that use both an internal combustion engine and a fuel battery directly obtaining electrical energy using chemical reactions occurring when hydrogen and oxygen are continuously supplied or both a battery and a fuel battery are being developed.

The number of battery cells employed by a vehicle using an electric motor (or battery-motor) is increasing to enhance power. Accordingly, a battery management system (hereinafter, referred to as "BMS") for efficiently managing control of sensing of the cell voltages of the employed battery cells and balancing of the battery cells is employed in the vehicle.

Meanwhile, when the number of battery cells in a vehicle using an electric motor (or a battery-motor) needs to be increased, both the hardware and software of the BMS needs to be changed according to the increase in the number of battery cells. Thus, when the number of battery cells increase, costs for changing a software program as well as a hardware structure for the BMS are incurred.

SUMMARY

Embodiments are therefore directed to a battery management system and driving method for the same, which substantially overcome one or more of the problems due to the limitations and disadvantages of the related art.

It is therefore a feature of an embodiment to provide a battery management system that uses a source file for sensing of the cell voltages of battery cells by changing only declaration information of a header file even when the number of battery cells is changed, and a driving method for the same.

At least one of the above and other features and advantages may be realized by providing a battery management system connected to a battery including at least one battery pack in which a plurality of battery cells are contained, the system including a sensor including an analog-to-digital (ADC) converter connected to the battery cells and configured to sense the cell voltages of the battery cells, a storage configured to store source data generated using an input external signal, and a controller configured to generate a source signal corresponding to the source data and forward the source signal to the sensor, the sensor being configured to sense the cell voltages of the battery cells according to the source signal.

The storage may include a header file loaded by the controller, the external signal being input to the header file, and a source file generating the source data from the external signal.

The external signal may include a total number of battery cells and a basic number of battery cells allocated to each channel of the AD converter.

The source data may include the basic number of battery cells substantially allocated to each channel of the AD converter and a cell voltage sensing time of all the battery cells.

When there is a difference between a number of battery cells obtained by multiplying a number of channels of the AD converter by the basic number of battery cells allocated to each channel of the AD converter input to the header file and the number of all battery cells input to the header file, the source file may be programmed to sequentially allocate the battery cells corresponding to the difference to each channel of the AD converter.

The number of channels of the AD converter may be set in the source file in advance.

The source file may be programmed to obtain a cell voltage sensing time of all the battery cells by adding the time obtained by multiplying the basic number of battery cells allocated to each channel of the AD converter by a voltage sensing time for one battery cell corresponding to each channel of the AD converter to a cell voltage sensing time for a number of battery cells corresponding to the difference.

The voltage sensing time for one battery cell corresponding to each channel of the AD converter may be set in the source file in advance.

The sensor may further include a control signal generator configured to generate a control signal for sensing of the cell voltages of the battery cells from the source signal.

The storage may be an electrically erasable programmable read-only memory (EEPROM).

The sensor may be configured to sense a pack current and a pack voltage of the battery pack, and the controller may be configured to estimate a state of charge (SOC) using the pack current, the pack voltage, and the cell voltages.

In At least one of the above and other features and advantages may be realized by providing a driving method for a battery management system connected to a battery including at least one battery pack in which a plurality of battery cells are contained, the method including loading a header file from a storage by a controller connected to a sensor including an AD converter connected to the battery cells, inputting an external signal corresponding to information of the header file by the controller, and generating a source signal corresponding to source data created from an external signal input to the header file using a program stored in the source file of the storage by the controller, wherein the sensor senses the cell voltages of the battery cells according to the source signal.

The external signal may include a total number of battery cells and a basic number of battery cells allocated to each channel of the AD converter.

The source data may include the basic number of battery cells allocated to each channel of the AD converter and a cell voltage sensing time for all the battery cells.

When there is a difference between a number of battery cells obtained by multiplying the number of channels of the AD converter by the basic number of battery cells allocated to each channel of the AD converter input to the header file and the total number of battery cells input to the header file, the source file may be programmed to sequentially allocate the battery cells corresponding to the difference to each channel of the AD converter.

The number of channels of the AD converter may be set in the source file in advance.

The source file may be programmed to obtain a cell voltage sensing time of all the battery cells by adding the time obtained by multiplying the number of battery cells basically allocated to each channel of the AD converter by a voltage sensing time for one battery cell corresponding to each channel of the AD converter to a cell voltage sensing time for a number of battery cells corresponding to the difference.

The voltage sensing time for one battery cell corresponding to each channel of the AD converter may be set in the source file in advance.

At least one of the above and other features and advantages may be realized by providing An article of manufacture having a machine accessible medium including data that, when accessed by a machine, cause the machine to perform a method for driving a battery management system in accordance with above described method.

BRIEF DESCRIPTION OF THE DRAWINGS

The above and other features and advantages will become more apparent to those of ordinary skill in the art by describing in detail exemplary embodiments with reference to the attached drawings, in which:

FIG. 4 illustrates a flowchart of the operation of the MCU when an external signal is input to a controller of FIG. 2;

FIG. 5 illustrates a schematic diagram of a sensor of FIG. 1 according to an embodiment;

DETAILED DESCRIPTION

Korean Patent Application No. 10-2009-0034740, filed on Apr. 21, 2009, in the Korean Intellectual Property Office, and entitled: "Battery Management System and Driving Method for the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the entire specification, it is to be noticed that when a certain element is "connected" to another element, it means that they are "directly connected" to each other or "electrically connected" to each other with another device being interposed therebetween. It is also to be noticed that the term "comprising" or "including" used in the entire specification should not be interpreted as being restricted to the means listed thereafter and does not exclude other elements.

As discussed in detail below, a battery management system and driving method thereof may use a common source file regardless of the number of battery cells. In particular, by loading a header file containing a total number of battery cells and a basic number of battery cells basically allocated to each channel of an AD converter used in a sensor that senses cell voltages, even when the number of battery cells connected to a battery management system is changed, a source file for sensing of the cell voltages of the changed battery cells does not need to be additionally changed. Thus, costs for changing the source file, as well as the hardware structure of the battery management system, when the number of battery cells is changed, may be reduced.

Figure 1:
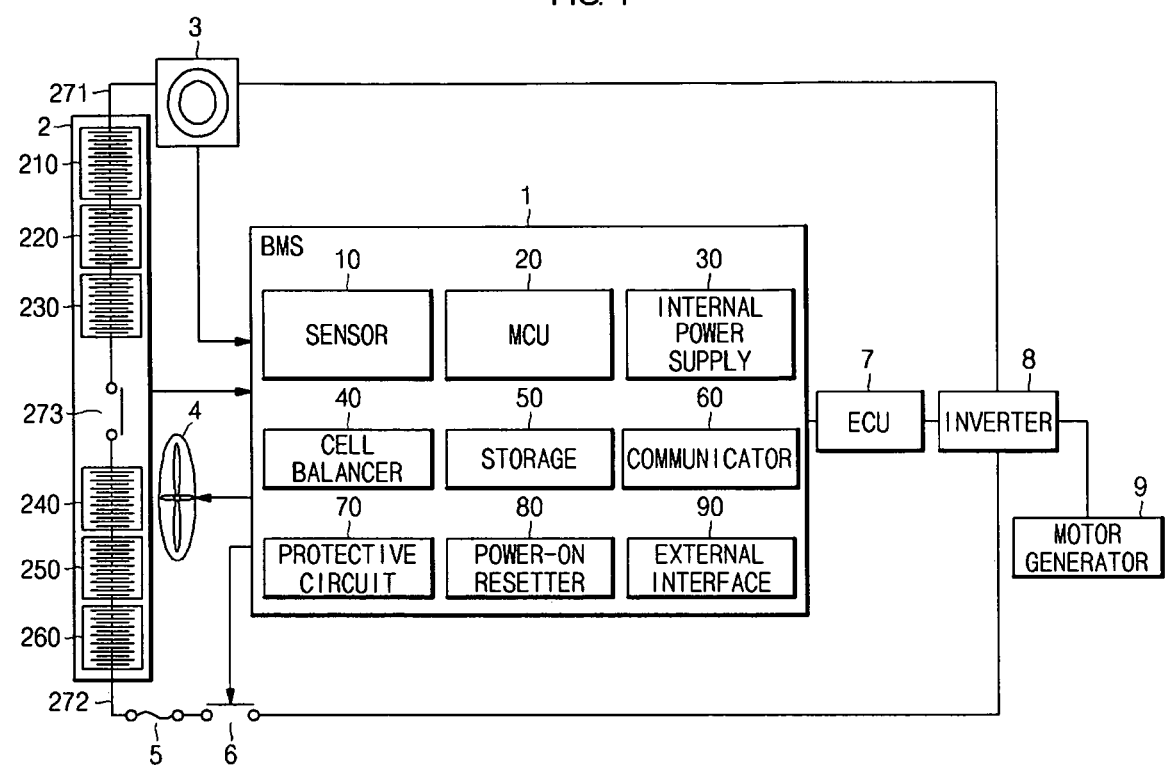
FIG. 1 illustrates a block diagram schematically of a battery, a BMS, and peripheral devices of the BMS according to an embodiment.
Figure 2:
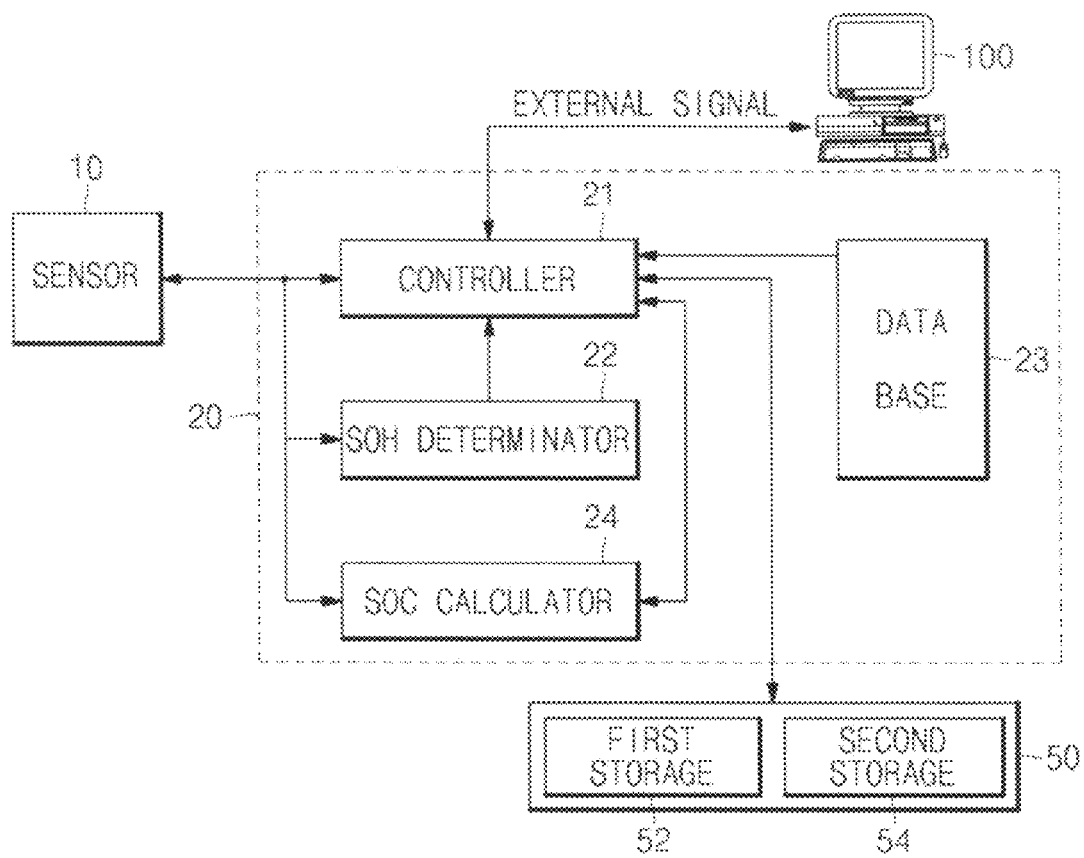
FIG. 2 illustrates a block diagram of an MCU of FIG. 1 according to an embodiment.
Figure 3:
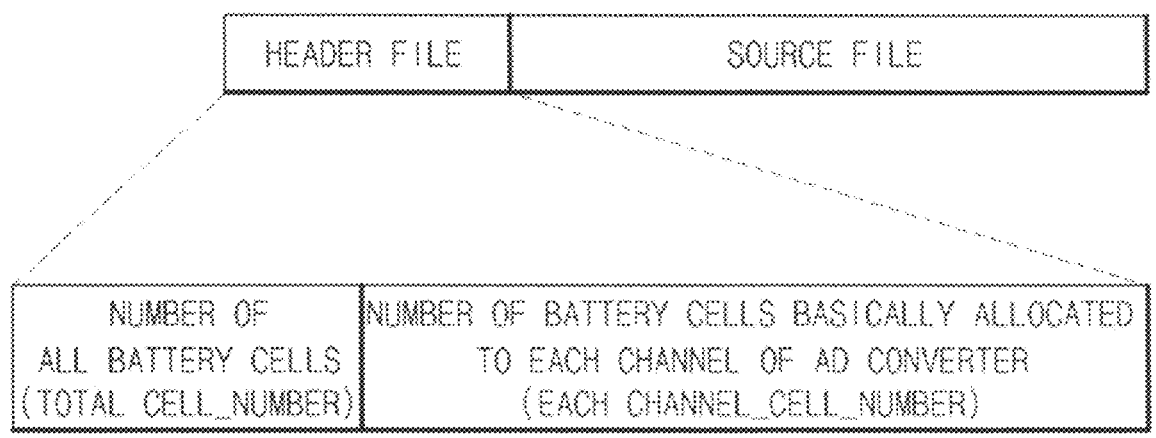
FIG. 3 illustrates a second storage of FIG. 2 according to an embodiment.

FIG. 1 illustrates a block diagram of a battery, a BMS, and peripheral devices of the BMS according to an embodiment. FIG. 2 illustrates a block diagram of a main control unit (MCU) of FIG. 1. FIG. 3 illustrates a second storage of FIG. 2.

As illustrated in FIG. 1, a vehicle system may include a BMS 1, a battery 2, a current sensor 3, a cooling fan 4, a fuse 5, a main switch 6, an engine controller unit (ECU) 7, an inverter 8, and a motor generator 9. First, the peripheral devices connected to the front end of the BMS 1 will be described.

The battery 2 may include a plurality of sub-packs 210, 220, 230, 240, 250, and 260 connected in series to each other, output terminals 271 and 272, and a safety switch 273 connected between the sub-packs 230 and 240. The sub-packs 210, 220, 230, 240, 250, and 260 may be classified into a first sub-pack 210, a second sub-pack 220, a third sub-pack 230, a fourth sub-pack 240, a fifth sub-pack 250, and a sixth sub-pack 260.

In the example illustrated in FIG. 1, the first sub-pack 210 includes eight rechargeable battery cells connected in series to each other and each of the second to sixth sub-packs 220 to 260 includes seven rechargeable batteries connected in series to each other, respectively. Meanwhile, although the battery 2 includes forty three battery cells in the example embodiment, embodiments are not limited thereto. Here, each sub-pack merely refers to one group including a plurality of battery cells, and the forty three battery cells of the battery 2 may be directly connected to each other without using the first to sixth sub-packs 210 to 260.

The output terminals 271 and 272 may be connected to motor generator 9 of the vehicle through the inverter 8 to supply electrical energy to the engine of the vehicle. The switch 273 may be connected between the third sub-pack 230 and the fourth sub-pack 240 and may be manually switched on and off to insure the safety of an operator when the battery 2 is replaced or when an operation on the battery 2 is performed. Although the safety switch 273 is connected between the third sub-pack 230 and the fourth sub-pack 240 in the example embodiment, embodiments are not limited thereto.

The current sensor 3 measures the output current of the battery 2 and may output the measured output current to a sensor 10 of the BMS 1. In more detail, the current sensor 3 may be a Hall effect current transformer (CT) that measures a current using the Hall effect and outputs an analog current signal corresponding to the measured current.

The cooling fan 4 may reduce heat generated during the charging/discharging operation of the battery 2 in accordance with a control signal of the BMS 1. Reduction of heat may prevent deterioration of the battery 2 and may prevent lowering of charge/discharge efficiency due to rising temperature.

The fuse 5 prevents transfer of an overcurrent to the battery due to disconnection or a short circuit. That is, if an overcurrent is generated, the fuse 5 is disconnected to prevent transfer of the overcurrent to the battery 2.

If an abnormal phenomenon, e.g., an overvoltage, an overcurrent, or a high temperature occurs, the main switch 6 switches on and off the battery 2 based on a control signal of the BMS 1 or the ECU 7 of the vehicle.

The BMS 1 may include a sensor 10, a MCU 20, an internal power supply 30, a cell balancer 40, a storage 50, a communicator 60, a protective circuit 70, a power-on resetter, and an external interface 90.

The sensor 10 may measure the pack current and pack voltage of the battery 2 and the cell voltages, cell temperatures, and ambient temperatures of the battery cells, and may forward the measurements to the MCU 20.

The MCU 20 may estimate the state of charging (SOC) and state of health (SOH) of the battery 2 based on digital data corresponding to the pack current and pack voltage of the battery 2 and the cell voltages, cell temperatures, and ambient temperatures of the battery cells to control the charging/discharging operation of the battery 2. Here, the MCU 20 considers the SOH of the battery 2 to accurately estimate the SOC of the battery 2.

To achieve this, as illustrated in FIG. 2, the MCU 20 may include a controller 21, an SOH determinator 22, a database 23, and an SOC calculator 24.

The controller 21 may receive a pack current, a pack voltage, and a cell temperature from the sensor 10 and the accumulated amount of current from the SOH determinator 22 at a preset time interval. Here, the preset time interval may be approximately 10 ms. The controller 21 may compare the pack current, the pack voltage, the cell temperature, and the accumulated amount of discharge with a data table stored in the database 23. The controller 21 may generate a SOC reset signal according to the comparison result and may transmit the SOC reset signal to the SOC calculator 24. The controller 21 may detect the direction of a pack current to determine whether a charging or discharging operation is to be performed, When a pack current flows from the battery 2 to the motor generator 9 of the vehicle, the SOH determinator 22 accumulates the pack current and determines the accumulated amount of discharge. As the accumulated amount of discharge increases, the battery 2 may be determined to be deteriorated. The SOH 22 may transmit the accumulated amount of discharge during the preset time interval to the controller 21.

A table containing the pack current, the pack voltage, the cell temperature, and the accumulated amount of discharge may be stored in the database 23. The data table may include data realized by repeated experiments. The data may include recorded pack currents, pack voltages, and cell temperatures measured by experiments for the accumulated amounts of discharge with reference to the SOCs of the sub-packs.

The SOC calculator 24 may calculate the SOC of a pack using the following equation 1 and may output the calculated SOC to the controller 21.

$$SOC = \frac{\int (i \times \eta) dt}{TAC} \times 100[\%] \quad \text{Equation 1}$$

where i is a charging/discharging current and represents an average pack current, η is a charging efficiency of the battery 2, and TAC is a total amount of charge.

The SOC calculator 24 may reset the previous SOC according to an SOC reset instruction received from the controller 21 and may calculate an SOC of a sub-pack using Equation 1. Resetting of the SOC means that when the state of the battery 2, determined based on a pack current, a pack voltage, etc., corresponds to a certain condition, the previous SOC value is ignored using data obtained through an experiment and a new SOC value is set to the SOC value of the battery 2. Then, the new SOC value is referred to as a 'reset SOC'. In a normal state, the SOC estimated using Equation 1 is output as the current SOC of the battery 2. However, since the SOC calculated using Equation 1 is calculated based on a pack current value, it may be different from the actual SOC of the battery 2. The reset SOC may be used to compensate for the difference between them.

The MCU 20 may forward information regarding the state of the battery 2 to the ECU 7 of the vehicle. The ECU 7 of the vehicle charges or discharges the battery 2 based on the SOC and SOH forwarded from the MCU 20.

The MCU 20 may receive an external signal containing a total number of battery cells and a basic number of battery cells allocated to each channel of an AD converter 160 of the sensor 10 (described in detail below with reference to FIGS. 5 and 6) from an external electronic device 100, e.g., a computer, through the controller 21 and may store the external signal in the storage 50. The MCU 20 may also create a source signal in accordance with source data obtained from the received external signal, i.e., the basic number of battery cells substantially allocated to each channel of the AD converter and the cell voltage sensing time of all the battery cells, and may forwards the created source signal to a control signal generator 110 (see FIG. 6) of the sensor 10. The source signal may be a cell voltage sensing signal of the battery cell.

Returning to FIG. 1 and the other elements of the BMS 1, the internal power supply 30 generally supplies power to the BMS 1, e.g., using an auxiliary battery. The cell balancer 40 balances the charging states of the battery cells. That is, the cell balancer 40 may discharge battery cells whose charging states are relatively high and may charge battery cells whose charging states are relatively low.

The storage 50 may include a first storage 52 and a second storage 54, as illustrated in FIG. 2. When the internal power supply 30 of the BMS 1 is turned off, data, e.g., the current SOC and SOH, may be stored in the first storage 52. As illustrated in FIG. 3, a header file and a source file may be stored in the second storage 54. In more detail, the header file may contain declaration information regarding the total number of battery cells and declaration information regarding the basic number of battery cells allocated to each channel of the AD converter 160. The external signal received from the controller 21, i.e. the total number of battery cells and the basic number of battery cells allocated to each channel of the AD converter 160, may be input to the declaration information regarding the total number of battery cells and the declaration information regarding the basic number of battery cells allocated to each channel of the AD converter 160. The source file obtains source data containing the basic number of battery cells allocated to each channel of the AD converter 160 and the cell voltage sensing time of all the battery cells from the external signal input to the header file. Here, the source file is programmed to obtain the number of battery cells substantially allocated to each channel of the AD converter and the cell voltage sensing time of all the battery cells. The above-described storage 50 may be an electrically erasable nonvolatile storage, e.g., an electrically erasable programmable read-only memory (EEPROM).

Referring again to FIG. 1 and other elements of the BMS 1, the communicator 60 may provide communication between the MCU 20 and the ECU 7. The protective circuit 70 may protect the BMS 1 from an external shock, an overcurrent, and/or a low voltage, e.g., using firmware.

The power-on resetter 80 may reset the entire system when the internal power supply 30 of the BMS 1 is turned on. The external interface 90 may connect peripheral devices, e.g., the cooling fan 4 and the main switch 6, to the BMS 1, i.e., to the MCU 20. In the example embodiment illustrated in FIG. 1, although only the cooling fan 4 and the main switch 6 are illustrated, embodiments are not limited thereto.

The ECU 7 may determine torque based on information regarding the accelerator, brake and speed of the vehicle, and may control the output of the motor generator 9 in accordance with the determined torque. In particular, the ECU 7 may control switching of the inverter 8 and the output of the motor generator 9 in accordance with the torque. The ECU 7 may receive the SOC of the battery 2 from the MCU 20 through the communicator 60 of the BMS 1 and may control the SOC of the battery 2 to be a target value, e.g., 55%. For example, if the SOC of the battery 2 forwarded from the MCU 20 is less than or equal to the target value, the switch of the inverter 8 may be controlled to output power to charge the battery 2, in which case the pack current I may be a positive value. On the other hand, is the SOC of the battery 2 is greater than the target value, the switch of the inverter 8 may be controlled to output power to the motor generator 9 to discharge the battery 2, in which case the pack current I may be a negative value. In addition, the ECU 7 may receives the SOH of the battery 2 from the MCU 20 through the communicator 60 and may display the SOH, e.g., on an instrument panel of the vehicle.

As discussed above, the inverter 8 may charge or discharge the battery 2 based on a control signal of the ECU 7. The motor generator 9 may drive the vehicle based on torque information forwarded from the ECU 7 using electrical energy of the battery 2.

Hereinafter, the operation of the MCU 20 performed when an external signal is input from an external electronic device 100 to the controller 21 of the MCU 20 of the BMS 1 will be described. FIG. 4 illustrates a flowchart of the operation of the MCU 20 performed when an external signal is input to the controller 21 of FIG. 2 according to an embodiment.

First, it is assumed that the controller 21 of the MCU 20 is connected to the external electronic device 100 and an external signal containing information including a total number of battery cells, here assumed to be 43, and a basic number of battery cells allocated to each channel of the AD converter 160, here 7, is transmitted to the controller 21. In response, the MCU 20 may perform a header file loading operation S10, an external signal inputting operation S20, and a source signal creating operation S30.

In the header file loading operation S10, the controller 21 loads the header file of the second storage 54.

Next, in the external signal inputting operation S20, the controller 21 inputs an external signal in correspondence to information of the header file. For example, the controller 21 inputs an external signal of 43 for the declaration information regarding the number of all the battery cells contained in the header file and inputs an external signal of 7 for the declaration signal regarding the basic number of battery cells allocated to each channel of the AD converter 160. Here, since the external signals of 43 and 7 are only examples and may be varied as the declaration information of the header file is changed, embodiments are not limited thereto.

If an external signal is input to the header file in this way, source data containing the basic number of battery cells allocated to each channel of the AD converter and the cell voltage sensing time of all the battery cells is obtained from the external signal input to the header file by a program of the source file. The source file may be programmed to sequentially allocate the battery calls corresponding to the difference between the number of battery cells obtained by multiplying the number of battery cells basically allocated to each channel of the AD converter 160 by the number of the channels of the AD converter 160 and all the battery cells to each channel of the AD converter 160. The number of the channels of the AD converter 160 may be preset in the source file. The source file is programmed to obtain the cell voltage sensing time of all the battery cells by adding the time obtained by multiplying the number of battery cells basically allocated to each channel of the AD converter 160 by the voltage sensing time for one battery cell corresponding to each channel of the AD converter 160 to the cell voltage sensing time for the battery cells corresponding to the difference. The voltage sensing time for one battery cell corresponding to each channel to the AD converter may be preset in the source file.

For example, when the number of channels of the AD converter 160 is determined to be 6 in hardware in advance (that is, the number of capacitors charging the cell voltages of the battery cells is determined to be 6), seven (external signals) battery cells are basically connected to each of the six channels of the AD converter by the source file. In other words, 42 (6×7) battery cells of the 43 battery cells are connected to the six channels of the AD converter 160. The remaining one (43−42) battery cell may be additionally connected to the first channel of the AD converter 160. When the number of the remaining battery cells is two, the two remaining battery cells may be sequentially connected to the first and second channels of the AD converter 160, and so forth.

In other words, the total number of battery cells may be divided by the number of channels of the AD converter 160. The integer value of this division may be set as the basic number of battery cells to be connected to each channel of the AD converter 160. The remainder may be sequentially connected to corresponding channels of the AD converter 160, so that data from all battery cells are processed. Thus, a change in the number of battery cells may only change the basic number of battery cells connected to the AD converter 160, while allowing use of the same source program stored in the source file.

In this way, if a total of 8 batteries (the seven basic battery cells+the remaining one battery cell) are connected to the first channel of the AD converter and seven battery cells are connected to each of the second to sixth channels of the AD converter, the cell voltage sensing time of all the battery cells may be finally obtained. The cell voltage sensing time of all the battery cells may be obtained by adding the number of battery cells basically allocated to each channel of the AD converter 160 the cell voltage sensing time for one battery cell corresponding to each channel of the AD converter (set in the source file in advance, for example, 10 ms), to the voltage sensing time for one battery cell additionally connected to the first channel of the AD converter. That is, for this particular example, the cell voltage sensing time of all the battery cells may be 80 ms ((7×10 ms)+10 ms).

Next, in the source signal creating operation S30, the controller 21 may create a source signal for source data, i.e. the basic number of battery cells allocated to each channel of the AD converter and the cell voltage sensing time for all the battery cells obtained from the external signal input to the header file by the source program of the source file. The controller 21 may forward the source signal to the control signal generator 110 of the sensor 10. Then, the control signal generator 110 may generate a control signal from the source signal received from the controller 21 and may control the sensor 10 using the control signal.

Next, the operation of a cell voltage measurer 120 controlled by a control signal of the control signal generator 110 of the sensor 10 will be described with reference to FIGS. 5 to 7.

FIG. 5 illustrates a schematic view of the sensor 10 of FIG. 1 according to an embodiment. Referring to FIG. 5, the sensor 10 may include the control signal generator 110, the cell voltage measurer 120, a pack voltage measurer 130, a pack current measurer 140, a temperature measurer 150, and the AD converter 160.

The control signal generator 110 may receive a signal from the MCU 20, in particular, from the controller 21, may generate control signals BANK1_SENSE to BANK8_SENSE (See FIG. 6), a control signal MODULE_SW (See FIG. 6), and a control signal MODULE (See FIG. 6), and may output these signals to the cell voltage measurer 120. In turn, the cell voltage measurer 120 may sequentially measure the voltages of the 43 battery cells. Here, the eight control signals BANK1_SENSE to BANK8_SENSE may be sequentially input, the control signal MODULE_SW may be input when one of the eight control signals BANK1_SENSE to BANK8_SENSE is input, and the control signal MODULE may be input when none of the eight control signals BANK1_SENSE to BANK8_SENSE and the control signal MODULE_SW is input.

The cell voltage measurer 120 may measure the analog voltages of the 43 battery cells 211 to 267 of the battery 2 and may output the analog voltage to the AD converter 160.

The pack voltage measurer 130 may measure an analog voltage between the output terminal 271 (See FIG. 1) of the battery 2 and the output terminal 272, and may output the analog voltage to the AD converter 160.

The pack current measurer 140 may convert a current measured by the current sensor 3 (See FIG. 1) and output the converted current to the AD converter 160.

The temperature measurer 150 may output a digital value obtained by measuring the temperature and peripheral temperature of the battery 2 to the MCU 20 directly.

The AD converter 160 may convert analog values input from the cell voltage measurer 120, the pack voltage measurer 130, and the pack current measurer 140 into digital data, and may output the digital data to the MCU 20 (See FIG. 1). In more detail, the AD converter 160 may include eight input terminals and may sequentially convert analog data input from the input terminals to digital data. In the AD converter 160, the six input terminals (referred to as the first to sixth input terminals) of the eight input terminals may be connected to the output terminal of the cell voltage measurer 120, another input terminal (referred to as the seventh input terminal) may be connected to the pack voltage measurer 130, and the other input terminal (referred to as the eighth input terminal) may be connected to the pack current measurer 140.

Figure 6:
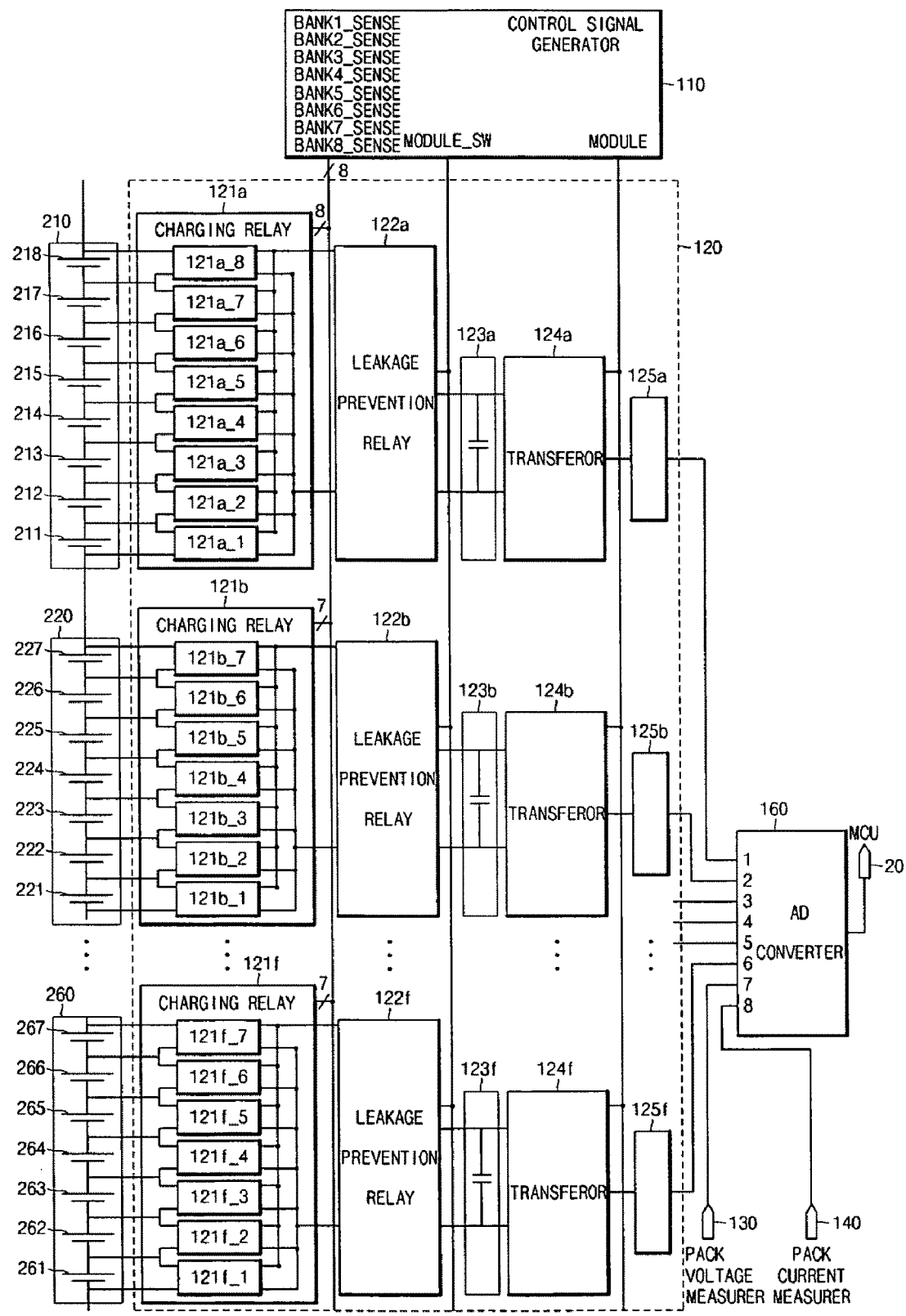
FIG. 6 illustrates a cell voltage measurer of FIG. 5 in detail.

FIG. 6 illustrates the cell voltage measurer 120 of FIG. 5 in detail according to an embodiment. FIG. 7 illustrates a charging relay of FIG. 6 in detail according to an embodiment.

In FIG. 6, the third to fifth sub-packs 250 located between the second sub-pack 220 and the sixth sub-pack 260 are omitted for clarity. Likewise, the charging relays 121c to 121e, the leakage prevention relays 122c to 122e, the chargers 123c to 123e, and buffers 125c to 125e are omitted for clarity.

As illustrated in FIG. 6, the cell voltage measurer 120 may include charging relays 121a to 121f connected to the first to sixth sub-packs 210 to 260 respectively, leakage prevention relays 122a to 122f, chargers 123a to 123f, transferors 124a to 124f, and buffers 125a to 125f. Here, the first to sixth sub-packs 210 to 260 may be configured such that the 43 battery cells may be classified according to the number of batteries substantially connected to each channel of the AD converter 160 set by the example source file.

The charging relay 121a may include eight cell relays 121a_1 to 121a_8 turned on and off based on the eight control signals BANK1_SENSE to BANK8_SENSE output from the control signal generator 110. Here, the control signals BANK1_SENSE to BANK8_SENSE may be sequentially input to eight cell relays 121a_1 to 121a_8 for a preset period of time, respectively.

Figure 7:
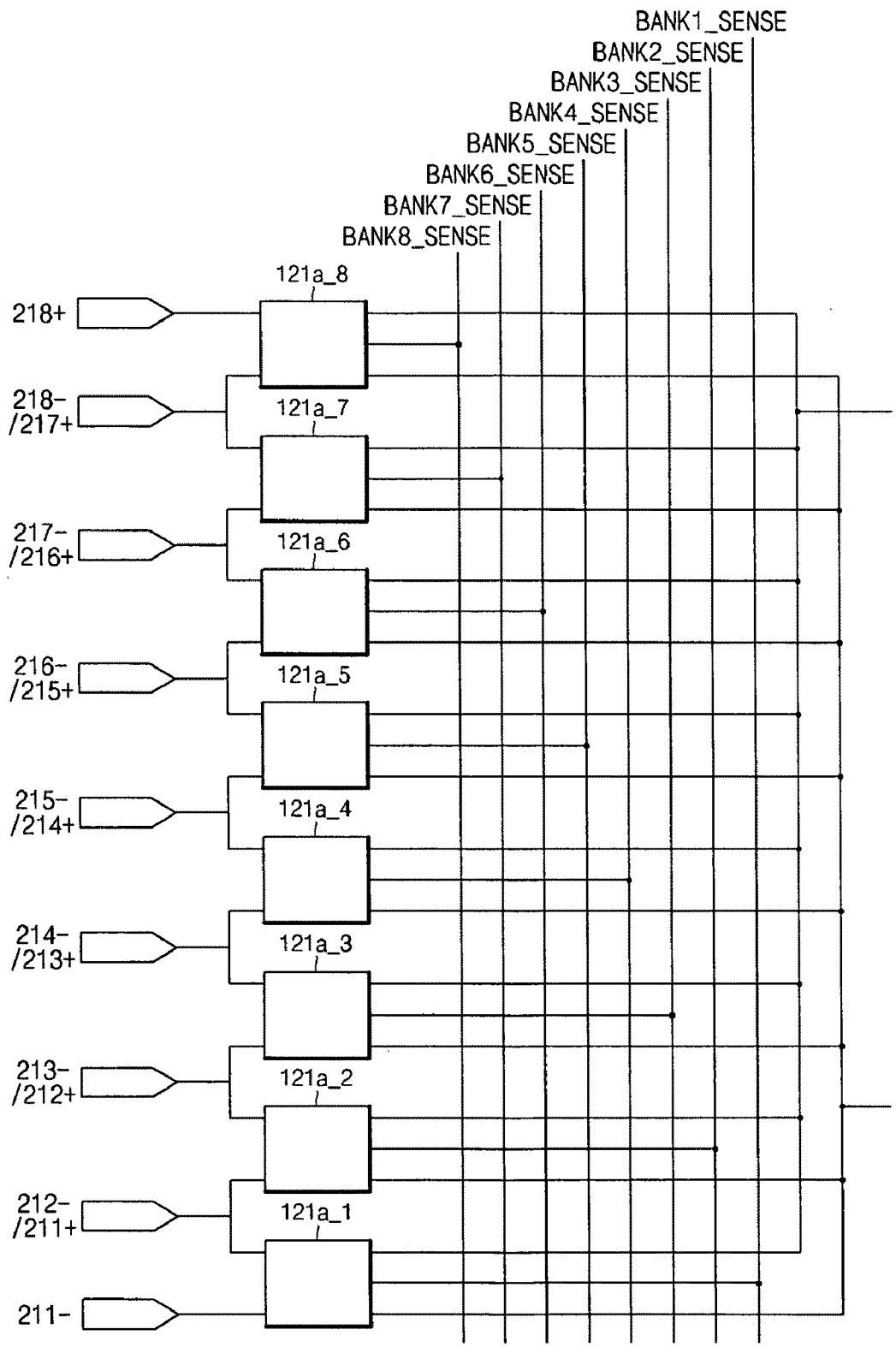
FIG. 7 illustrates a charge relay of FIG. 6 in detail.

In more detail, as illustrated in FIG. 7, the cell relay 121a_1 may be connected to the negative terminal 211− of the battery cell 211 and the positive terminal 211+ of the battery cell 211.

The cell relay 121a_1 may be turned on based on the input control signal BANK1_SENSE to transfer the voltage of the battery cell 211.

The cell relay 121a_2 may be connected to the negative terminal 212− of the battery cell 212 and the positive terminal 212+ of the battery cell 212. The cell relay 121a_2 may be turned on based on the control signal BANK2_SENSE to transfer the voltage of the battery cell 212. Likewise, the cell relays 211a_3 to 121a_8 may be turned on based on the control signals BANK3_SENSE to BANK8_SENSE to transfer the voltages of the battery cells 213 to 218, respectively.

The leakage prevention relay 122a may transfer the voltage output from the charging relay 121a to the charger 123a based on the control signal MODULE_SW forwarded from the control signal generator 110. Here, when one of the cell relays 121a_1 to 121a_8 of the charging relay 121a is turned on, the leakage prevention relay 122a may be turned on to charge the charger 123a with a cell voltage. Thereafter, the leakage prevention relay 122a may be turned off to prevent the cell voltage stored in the charger 123a from leaking in the direction of the charging relay 121a. The charger 123a may include at least one capacitor to be charged with the cell voltage transferred by the leakage prevention relay 122a.

The transferor 124a may be turned on based on the control signal MODULE forwarded from the control signal generator 110 to output the cell voltage stored in the charger 123a to the buffer 125a. Since the control signal MODULE is input when none of the control signals BANK1_SENSE to BANK8_SENSE and the control signal MODULE_SW are input, the transferor 124a is not turned on when the charger 123a is charged with the cell voltage as the leakage prevention relay 122a and one of the cell relays 121a_1 to 121a_8 of the charging relay 121a are turned on. The transferor 124a may be turned-on when the leakage prevention relay 122a and cell relays 121a_1 to 121a_8 are turned off.

The buffer 125a may clamp the cell voltage output from the transferor 124a to a preset voltage range to output the clamped cell voltage to the first input terminal of the AD converter 160.

Meanwhile, since the structures and operations of the charging relays 121b to 121f, the leakage prevention relays 122b to 122f, the chargers 123b to 123f, the transferors 124b to 124f, and the buffers 125b to 125f are the same as those of the charging relay 121, a detailed description thereof will be not be repeated. However, since each of the charging relays 121b to 121f, the leakage prevention relays 122b to 122f, the chargers 123b to 123f, the transferors 124b to 124f, and the buffers 125b to 125f are connected to seven battery cells, they are not operated when the charging relay 121a, the leakage prevention relay 122a, the charger 123a, the transferor 124a, and the buffer 125a are operated for the battery cell 218 of the first sub-pack 210.

Hereinafter, the operation of the cell voltage measurer 120 will be described in detail with reference to FIG. 6 according to an embodiment. The control signal generator 110 outputs a high level signal as an ON signal and a low level signal as an OFF signal, or vice versa. The process of measuring the cell voltages of the first battery cells 211, 221, 231, 241, 251, and 261 included in the first to sixth sub-packs 210 to 260 connected to the six channels of the AD converter 160 is as follows.

First, the control signal BANK1_SENSE and the control signal MODULE_SW are high levels and the control signals BANK2_SENSE to BANK8_SENSE and the control signal MODULE are low levels. Therefore, the cell relay 121a_1 of the charging relay 121a is turned on by the control signal BANK1_SENSE of a high level and the cell relays 121a_2 to 121a_8 are turned off by the control signals BANK2_SENSE to BANK8_SENSE of low levels. The leakage prevention relay 122*a* is turned on by the control signal MODULE_SW of a high level and the transferor 124*a* is turned off by the control signal MODULE of a low level. Therefore, the voltage of the battery cell 211 is stored in the charger 123*a* through the charging relay 121*a* and the leakage prevention relay 122*a*.

Likewise, the cell relays 121*b*_1, 121*c*_1, 121*d*_1, 121*e*_1, and 121*f*_1 and the leakage prevention relays 122*b*, 122*c*, 122*d*, 122*e*, and 122*f* are turned on to store the voltages of the battery cells 221, 231, 241, 251, and 261 are stored in the chargers 123*b*, 123*c*, 123*d*, 123*e*, and 123*f* respectively.

After storage in the charger 123*a*, the control signals BANK1_SENSE to BANK8_SENSE and the control signal MODULE_SW are low levels and the control signal MODULE is a high level. Therefore, the cell relay 121*a*_1 is turned off by the control signal BANK1_SENSE of a low level and the leakage prevention relay 122*a* is turned off by the control signal MODULE_SW of a low level. The transferor 124*a* is turned on by the control signal MODULE of a high level to transfer the voltage of the cell 211 stored in the charger 123*a* to the first input terminal of the AD converter 160 through the buffer 125*a*.

Likewise, the voltages of the battery cells 221, 231, 241, 251, and 261 stored in the chargers 123*b*, 123*c*, 123*d*, 123*e*, and 123*f* through the transferors 124*b*, 124*c*, 124*d*, 124*e*, and 124*f* are transferred to the second to sixth input terminals of the AD converter 160 through the buffers 125*b*, 125*c*, 125*d*, 125*e*, and 125*f* respectively. The outputs of the pack voltage measurer 130 and the pack current measurer 140 may be input to the seventh and eighth input terminals of the AD converter 160.

In this way, the time for sensing the voltages of the battery cells 211, 221, 231, 241, 251, and 261 and inputting them to the AD converter 160 may be 10 ms, i.e., the cell voltage sensing time set in the source file. The AD converter 160 may convert signals input through the first to eighth input terminals digital data to output the converted digital date to the MCU 20.

Meanwhile, since the processes of measuring the cell voltages of the second battery cells 212, 222, 232, 242, 252, and 262 to the seventh battery cells 217, 227, 237, 247, 257, and 267 in the first to sixth sub-packs 210 to 260 are the same as the process of the cell voltages of the first battery cells 211, 221, 231, 241, 251, and 261 in the first to sixth sub-packs 210 to 260, a detailed description thereof will not be repeated. In this way, since the cell voltage measuring time of the first battery cells 211, 221, 231, 241, 251, and 261 in the first to sixth sub-packs 210 to 260 is 10 ms for this particular example, the cell voltage measuring time of the first battery cells 211, 221, 231, 241, 251, and 261 to the seventh battery cells 217, 227, 237, 247, 257, and 267 in the first to sixth sub-packs 210 to 260 may be a total of 70 ms.

Next, the process of measuring the cell voltage of the remaining one battery cell 218 in the first sub-pack 210 will be described.

First, the control signal BANK8_SENSE and the control signal MODULE_SW are high levels and the control signals BANK1_SENSE to BANK7_SENSE and the control signal MODULE are low levels. Therefore, the cell relay 121*a*_8 of the charging relay 121*a* is turned on by the control signal BANK8_SENSE of a high level and the cell relays 121*a*_1 to 121*a*_7 are turned off by the control signals BANK1_SENSE to BANK7_SENSE of low levels. The leakage prevention relay 122*a* is turned on by the control signal MODULE_SW of a high level and the transferor 124*a* is turned off by the control signal MODULE of a low level. Therefore, the voltage of the battery cell 211 is stored in the charger 123*a* through the charging relay 121*a* and the leakage prevention relay 122*a*.

After storage in the charger 123_*a*, the control signals BANK1_SENSE to BANK8_SENSE and the control signal MODULE_SW are low levels and the control signal MODULE is a high level. Therefore, the cell relay 121*a*_8 is turned off by the control signal BANK8_SENSE of a low level and the leakage prevention relay 122*a* is turned off by the control signal MODULE_SW of a low level. The transferor 124*a* is turned on by the control signal MODULE of a high level to transfer the voltage of the cell 211 stored in the charger 123*a* to the first input terminal of the AD converter 160 through the buffer 125*a*.

In this way, the time for sensing the voltages of the battery cells 211, 221, 231, 241, 251, and 261 and inputting them to the AD converter 160 may be 10 ms, i.e. the cell voltage sensing time set in the source file.

The AD converter 160 sequentially reads input signals input through the first input terminal, the seventh input terminal, and the eighth input terminal and converts the input signals into digital data to output the converted digital data to the MCU 20.

The time for measuring all of the cell voltages of the forty three battery cells included in the first to sixth sub-packs 260 connected to the six channels of the AD converter may be 80 ms (70 ms+10 ms) for this specific example.

As described above, according to aspects of embodiments, by loading a header file through a controller of the battery management system and inputting an external signal containing the total number of battery cells and the basic number of battery cells allocated to each channel of the AD converter to the header file, even when the number of battery cells connected to a battery management system changes, a source file for sensing of the cell voltages of the changed battery cells does not need to be additionally changed. Therefore, embodiments may use a common source file regardless of the number of battery cells, thus reducing costs for changing the source file, as well as the hardware structure of the battery management system, when the number of battery cells is changed.

Exemplary embodiments have been disclosed herein, and although specific terms are employed, they are used and are to be interpreted in a generic and descriptive sense only and not for purpose of limitation. For example, the processing of embodiments may be implemented firmware or in software, e.g., by an article of manufacture having a machine-accessible medium including data that, when accessed by a machine, cause the machine to drive a battery management system. Accordingly, it will be understood by those of ordinary skill in the art that various changes in form and details may be made without departing from the spirit and scope of the present invention as set forth in the following claims.

What is claimed is:

1. A battery management system to be connected to a battery including at least one battery pack in which a plurality of battery cells are contained, the system comprising:
   a sensor including an analog-to-digital (AD) converter connected to the battery cells, the sensor configured to sense cell voltages of the battery cells;
   a storage configured to store source data obtained from an external signal, the storage including a header file loaded by the controller, the header file being configured to store the external signal, and a source file that obtains the source data from the external signal; and
   a controller configured to generate a source signal corresponding to the source data and forward the source signal to the sensor, the sensor being configured to sense the cell voltages of the battery cells in accordance with the source signal, wherein:
   the external signal includes a total number of battery cells and a basic number of battery cells allocated to each channel of the AD converter, and the source file is programmed such that when there is a difference between a number of battery cells obtained by multiplying a number of channels of the AD converter by the basic number of battery cells allocated to each channel of the AD converter in the header file and the total number of battery cells in the header file, the source file sequentially allocates the battery cells corresponding to the difference to corresponding channels of the AD converter.

2. The battery management system as claimed in claim 1, wherein the source data includes the basic number of battery cells allocated to each channel of the AD converter and a cell voltage sensing time of all the battery cells.

3. The battery management system as claimed in claim 1, wherein the number of channels of the AD converter is set in the source file in advance.

4. The battery management system as claimed in claim 1, wherein the source file is programmed to obtain a cell voltage sensing time of all the battery cells by adding the time obtained by multiplying the number of battery cells basically allocated to each channel of the AD converter by a voltage sensing time for one battery cell corresponding to each channel of the AD converter to a cell voltage sensing time for a number of battery cells corresponding to the difference.

5. The battery management system as claimed in claim 4, wherein the voltage sensing time for one battery cell corresponding to each channel of the AD converter is set in the source file in advance.

6. The battery management system as claimed in claim 1, wherein the sensor further includes a control signal generator configured to generate a control signal for sensing of the cell voltages of the battery cells from the source signal.

7. The battery management system as claimed in claim 1, wherein the storage is an electrically erasable programmable read-only memory (EEPROM).

8. The battery management system as claimed in claim 1, wherein:
the sensor is configured to sense a pack current and a pack voltage of the battery pack, and
the controller is configured to estimate a state of charge (SOC) using the pack current, the pack voltage, and the cell voltages.

9. A driving method for a battery management system connected to a battery including at least one battery pack in which a plurality of battery cells are contained, the method comprising:
loading a header file from a storage by a controller connected to a sensor, the sensor including an analog-to-digital (AD) converter connected to the battery cells;
inputting to the header file an external signal corresponding to information of the loaded header file, the inputting being carried out by the controller, the external signal including a total number of battery cells and a basic number of battery cells allocated to each channel of the analog-to-digital convert and
generating a source signal corresponding to source data created from the external signal input to the header file using a program stored in a source file of the storage by the generating being carried out by the controller, wherein, generating the source signal is carried out such that when there is a difference between the number of battery cells obtained by multiplying a number of channels of the AD converter by the basic number of battery cells allocated to each channel of the AD converter in the header file and the total number of all battery cells in the header file, generating the source signal includes sequentially allocating the battery cells corresponding to the difference to each channel of the AD converter, and
wherein the sensor senses the cell voltages of the battery cells according to the source signal.

10. The driving method as claimed in claim 9, wherein the source data includes the basic number of battery cells allocated to each channel of the AD converter and a cell voltage sensing time for all the battery cells.

11. The driving method as claimed in claim 9, wherein the number of channels of the AD converter is set in the source file in advance.

12. The driving method as claimed in claim 9, wherein the source file is programmed to obtain a cell voltage sensing time of all the battery cells by adding the time obtained by multiplying the basic number of battery cells allocated to each channel of the AD converter by a voltage sensing time for one battery cell corresponding to each channel of the AD converter to a cell voltage sensing time for a number of battery cells corresponding to the difference.

13. The driving method as claimed in claim 12, wherein the voltage sensing time for one battery cell corresponding to each channel of AD converter is set in the source file in advance.

14. An article of manufacture having a non-transitory machine accessible medium including data that, when accessed by a machine, cause the machine to perform a method for driving a battery management system, the method comprising:
loading a header file from a storage by a controller connected to a sensor, the sensor including an analog-to-digital converter connected to the battery cells;
inputting to the header file an external signal corresponding to information of the header file, the inputting being carried out by the controller, the external signal including a total number of battery cells and a basic number of battery cells allocated to each channel of the digital analog-to-digital converter; and
generating a source signal corresponding to source data created from external signal input to the header file using a program stored in a source file of the storage, the generating being carried out by the controller, wherein, when there is a difference between the number of battery cells obtained by multiplying a number of channels by the AD converter by the basic number of battery cells allocated to each channel of the AD converter in the header file and the total number of all battery cells in the header file, generating the source signal includes sequentially allocating the battery cells corresponding to the difference to each channel of the AD converter, and
wherein the sensor senses cell voltages of the battery cells according to the source signal.

* * * * *